US008869362B2

(12) United States Patent
Wijngaards et al.

(10) Patent No.: US 8,869,362 B2
(45) Date of Patent: Oct. 28, 2014

(54) METHOD OF FORMING AN ARRAY OF PIEZOELECTRIC ACTUATORS ON A MEMBRANE

(75) Inventors: David D. L. Wijngaards, Tegelen (NL); Hans Reinten, Velden (NL); Hendrik J. Stolk, Bergen (NL); Alex N. Westland, Baarlo (NL)

(73) Assignee: Oce-Technology B.V., Venlo (NL)

( * ) Notice: Subject to any disclaimer, the term of this patent is extended or adjusted under 35 U.S.C. 154(b) by 894 days.

(21) Appl. No.: 12/153,958

(22) Filed: May 28, 2008

(65) Prior Publication Data

US 2008/0295308 A1   Dec. 4, 2008

(30) Foreign Application Priority Data

May 30, 2007   (EP) .................................... 07109196

(51) Int. Cl.
*H01L 41/22*   (2013.01)
*H01L 41/083*   (2006.01)
*B41J 2/16*   (2006.01)

(52) U.S. Cl.
CPC ................ *B41J 2/161* (2013.01); *B41J 2/1628* (2013.01); *B41J 2/1645* (2013.01); *B41J 2/1629* (2013.01); *B41J 2/1631* (2013.01); *B41J 2/1642* (2013.01); *B41J 2/1632* (2013.01); *B41J 2/1646* (2013.01)
USPC ................ 29/25.35; 29/594; 29/842; 29/846; 216/38; 310/348; 310/365

(58) Field of Classification Search
USPC ........... 29/25.35, 842, 846, 594, 830; 216/33, 216/38, 36; 310/348, 363, 365; 438/3
See application file for complete search history.

(56) References Cited

U.S. PATENT DOCUMENTS

| | | | |
|---|---|---|---|
| 6,467,137 B1 | 10/2002 | Kanda et al. | |
| 6,698,073 B2 * | 3/2004 | Dekker et al. | ................ 29/25.35 |
| 7,089,635 B2 * | 8/2006 | Xu et al. | ....................... 29/25.35 |
| 2002/0066524 A1 | 6/2002 | Kagawa et al. | |
| 2004/0214352 A1 * | 10/2004 | Kijima et al. | ..................... 438/3 |
| 2005/0046678 A1 | 3/2005 | Owaki et al. | |
| 2005/0104938 A1 | 5/2005 | Mita et al. | |
| 2005/0184627 A1 * | 8/2005 | Sano et al. | .................... 310/363 |
| 2006/0082257 A1 | 4/2006 | Bibl et al. | |

FOREIGN PATENT DOCUMENTS

| | | | |
|---|---|---|---|
| JP | 9216358 A | | 8/1997 |
| JP | 11138807 A | * | 5/1999 |
| JP | 2002264336 A | | 9/2002 |
| JP | 2003174211 A | | 6/2003 |
| JP | 2004111850 A | | 4/2004 |
| JP | 2005153242 A | | 6/2005 |
| JP | 2007076331 A | | 3/2007 |
| WO | WO 2006/047326 A1 | | 5/2006 |

* cited by examiner

*Primary Examiner* — A. Dexter Tugbang
(74) *Attorney, Agent, or Firm* — Birch, Stewart, Kolasch & Birch, LLP (57) ABSTRACT

A method of forming an array of piezoelectric actuators on a membrane (18) which includes the steps of preparing a piezoelectric comb-like structure having an array of islands that are integrally connected by a continuous top portion and that form piezoelectric layers of the actuators, the islands having an electrode at a bottom side, attaching the comb-like structure with its bottom electrode to a surface of the membrane, removing the continuous top portion of the comb-like structure to thereby separate the actuators from one another, and forming top electrodes on the top surfaces of the piezoelectric layers of the actuators.

11 Claims, 5 Drawing Sheets

METHOD OF FORMING AN ARRAY OF PIEZOELECTRIC ACTUATORS ON A MEMBRANE

This non-provisional application claims priority under 35 U.S.C. §119(a) on European Patent Application No. 07109196.1 filed in the European Patent Office on May 30, 2007, which is herein incorporated by reference

BACKGROUND OF THE INVENTION

The present invention relates to a method of forming an array of piezoelectric actuators on a membrane. More particularly, the invention relates to a method of forming an array of piezoelectric actuators that forms part of an ink jet printing device.

An ink jet device is used in an ink jet printer for expelling an ink droplet in response to an electric signal energizing the piezoelectric actuator. The actuator, when energized, causes the membrane to flex into a pressure chamber, so that the pressure of liquid ink contained in that chamber is increased and an ink droplet is ejected from a nozzle that communicates with the pressure chamber.

In a typical ink jet printer, the ink jet device takes the form of an array of a large number of nozzles and actuator units, and the nozzles are arranged with a very small pitch so as to achieve a high resolution of the printer. As a result, a manufacturing process is required which permits a high nozzle density of the ink jet device. Further, since the membrane and the actuator are subject to mechanical strains that vary with high frequency, the membrane must firmly and reliably be connected with the actuator. In many conventional ink jet printers, the actuators operate in a longitudinal expansion mode of the piezoelectric material. The array of actuators is formed by a comb-like structure with a continuous top region of piezoelectric material that is formed integrally with a number of piezoelectric fingers that project towards the membrane and form the individual actuators. Electrodes are provided on the top surface of the continuous layer and on the tip ends of the fingers. These electrodes of the fingers are attached to the membrane. Such a structure may be produced from a solid block of piezoelectric material by cutting slots into the block, so as to form the individual fingers. Then, the comb structure is attached to the surface of the membrane.

In contrast, the present invention is concerned with a method of manufacturing an array of piezoelectric actuators that operate in a flexural mode of the piezoelectric material. In this case, an individual actuator is formed by a flat, relatively thin layer of piezoelectric material that is sandwiched between top and bottom electrodes and is attached to the membrane with its bottom electrode. When a voltage is applied to the electrodes, the piezoelectric layer experiences a bending deformation which causes the membrane to flex.

US 2005/0046678 A1 discloses an ink jet device of this latter type, and a manufacturing process wherein electrode layers and piezoelectric layers forming the individual actuators are successively formed and patterned on the membrane.

US 2006/008257 discloses a method according to the preamble of claim 1, wherein the actuators are formed on a body that includes a plurality of ink chambers and their respective membranes.

A similar method is known from US 2004/0066524 where the ink chambers are formed by etching away the corresponding parts of the body so as to leave only the membranes and the walls separating the ink chambers.

SUMMARY OF THE INVENTION

It is an object of the invention to provide a more reliable and efficient manufacturing process.

In order to achieve this object, the manufacturing process of forming an array of piezoelectric actuators on a common membrane comprises the steps of preparing a piezoelectric comb-like structure having an array of islands that are integrally connected by a continuous top portion and that are to form piezoelectric layers of the actuators, said islands having an electrode at a bottom side, attaching the comb-like structure with its bottom electrode to a surface of the membrane, removing the continuous top portion of the comb-like structure, thereby separating the actuators from one another, and forming top electrodes on the top surfaces of the piezoelectric layers of the actuators, wherein the membrane is initially configured as a thick carrier plate and, after the comb-like structure has been attached, is brought to a desired uniform thickness by removing material from the side opposite to the actuators so as to obtain a continuous flat bottom surface of the membrane extending over the a plurality of actuators.

The present method has the advantage that the piezoelectric actuators can be prepared in advance, before they are attached to the membrane. That is, before attachment, the piezoelectric material is already formed and poled, electrical conducting layers are deposited and the islands are defined.

The piezoelectric comb-like structure may be prepared by first preparing a piezoelectric slab with an electrode on a bottom side, and subsequently cutting grooves into the bottom surface of the slab thereby forming the array of islands that are integrally connected by a continuous top portion.

Further, although the piezoelectric layers of the individual actuators are relatively thin and are extended in a plane parallel to the plane of the membrane, it is possible, according to the present invention, to prepare a plurality of actuators, preferably the entire array or even a plurality of arrays on separate chips, from a single slab of piezoelectric material.

By cutting grooves into the bottom surface of the slab, the electrode that is provided on that surface is divided into individual bottom electrodes of the actuators. The cutting process precisely defines the shape and arrangement of the actuators in the array. When the slab is bonded to the membrane, the array of actuators formed on the bottom of the slab still form an integral structure, so that the task of precisely aligning the actuators relative to one another and relative to a member forming the pressure chambers below the membrane is greatly facilitated.

Thanks to the stability of the integrated piezoelectric slab, the attachment step can be performed reliably and without any risk of damage. Moreover, the attachment step that may be carried out by means of an adhesive is relatively robust and does not require a high surface quality of the surfaces of the electrodes and the membrane. When the actuators have been reliably attached to the membrane in this manner, the actuators can easily be separated from one another by simply grinding away the continuous top portion of the piezoelectric slab. Then, the actuators may be completed by forming the top electrodes on the separated piezoelectric islands.

The step of bonding the actuators to the membrane is performed in a state in which the membrane is still a relatively thick carrier plate with a sufficient strength to withstand any mechanical strains that may occur during the bonding step. Then, the membrane part of the carrier plate may be securely attached to a rigid substrate, and the membrane is brought to the desired thickness by removing material of the carrier plate on the side opposite to the actuators.

Preferably, the material of the carrier plate is removed by etching, grinding or a combination thereof. In a particularly preferred embodiment, the carrier plate is formed by an SOI wafer (Silicon On Insulator) with a relatively thin silicon layer forming the desired membrane, an insulating layer, e.g., silicon dioxide, serving as an etch stop, and another silicon layer forming the bulk of the carrier plate that will later be removed. Alternatively, the membrane part of a carrier plate may be attached to the bulk of a carrier plate by means of a temporary wafer bond. In such a case, the membrane may be separated, for example, by means of a thermal treatment.

Preferably, the slab is attached to the membrane by means of thermocompression bonding. In this thermocompression bonding step, the bottom electrode formed on the actuators may automatically be contacted with an electrical conductive structure on the membrane, so that the bonding step assures not only a high mechanical stability but also a good and reliable electrical contact.

The continuous top region of the slab from which the actuators are formed may be provided with a top electrode and, during the thermocompression bonding step, the top and bottom electrodes may be short-circuited in order to avoid any possibility of electrical damage that might otherwise be caused by the pyroelectric properties of the piezoelectric material.

Electronic components, e.g., for controlling the actuators, detecting malfunctions, or measuring temperature may be formed directly in the silicon layer that will later form the membrane. Electrical leads and electrodes for contacting the electronic components and the actuators may be formed on the surface of that layer that has been covered by a dielectric layer.

The rigid substrate may be formed by another silicon wafer which is suitably etched to form chambers accommodating the individual actuators, ink supply channels, feedthroughs and the like.

Electrical leads for contacting the top electrodes of the actuators may be formed directly on the surface of the membrane. Preferably, before forming the top electrodes, the peripheral portions of the piezoelectric actuators are covered by a ring of insulating material for insulating the side faces of the piezoelectric layer and for reliably separating and insulating the top and bottom electrodes of the actuators from one another.

BRIEF DESCRIPTION OF THE DRAWINGS

Preferred embodiments of the invention will now be described in conjunction with the drawings, wherein.

DETAILED DESCRIPTION OF THE INVENTION

Figure 1:
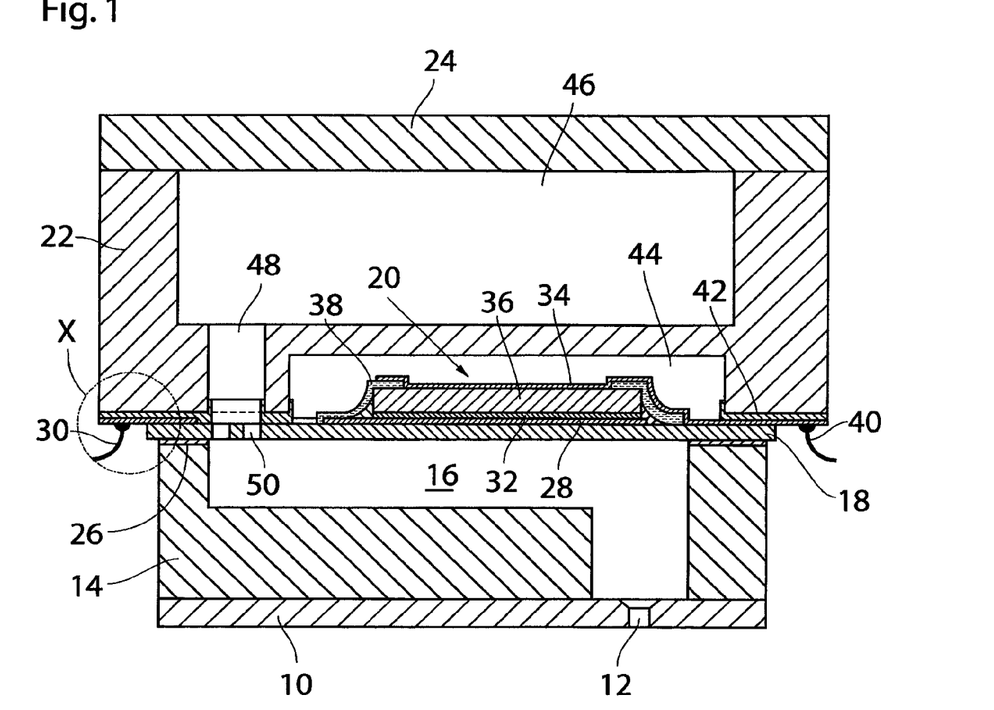
FIG. 1 is a cross-sectional view of an individual ink jet device manufactured by the method according to the present invention.

As is shown in FIG. 1, an ink jet device according to the invention has a layered structure comprising, from the bottom to the top in FIG. 1, a nozzle plate 10 with a nozzle 12 formed therein, a chamber plate 14 defining a pressure chamber 16 that communicates with the nozzle 12, a flexible membrane 18 carrying a piezoelectric actuator 20, a distribution plate 22 for supplying liquid ink to the pressure chamber 16, and an optional cover plate 24.

The chamber plate 14, the membrane 18 and the distribution plate 22 are preferably made of silicon, so that etching and photolithographic techniques known from the art of semiconductor processing can be utilised for reliably and efficiently forming minute structures of these components, preferably from silicon wafers. While FIG. 1 shows only a single nozzle and actuator unit, it is possible and preferable that an entire chip comprising a plurality of nozzle and actuator units, or a plurality of such chips, are formed in parallel by wafer processing. The use of identical, respectively similar materials for the above components has the further advantage that problems resulting from differential thermal expansion of the components can be avoided or effectively minimized.

The flexible membrane 18 is securely bonded to the chamber plate 14 by means of an adhesive layer 26 so as to cover the pressure chamber 16 and to define a top wall thereof. An electrically conductive structure 28 is formed on the top surface of the membrane and may be led out on at least one side, so that it may be in electrical contact with a wire bond 30, for example.

The piezoelectric actuator 20 comprises a bottom electrode 32 held in intimate large-area contact with the electrically conductive structure 28, a top electrode 34, and a piezoelectric layer 36 sandwiched therebetween. The piezoelectric layer 36 may be made of a piezoelectric ceramic such as PZT (Lead Zirconate Titanate) and may optionally contain additional internal electrodes.

The peripheral edge of the top surface of the piezoelectric layer 36 as well as the lateral surfaces of that layer are covered by an insulating layer 38. The peripheral portion of the top electrode 34 is superimposed on the insulating layer 38 and is led out to one side on the surface of the membrane 18, so that it may be in electrical contact with a wire bond 40.

At the locations where the electrical contacts, such as wirebonds 30 and 40, are made, the electrical leads are secured to the distribution plate 22 by means of another adhesive layer 42 that is also used to securely attach the top surface of the membrane 18 to the distribution plate.

It is observed that the bottom electrode 32 and preferably also the top electrode 34 of the actuator cover the entire surface of the piezoelectric layer 36, including the edge portions thereof, which contributes to an increase in power gain and volume displacement of the actuator. The insulating layer 38 reliably prevents the top and bottom electrodes from becoming short-circuited and also assures that the electrodes are separated everywhere by a sufficient distance, so that, when a voltage is applied to the electrodes, the strength of the electric field established therebetween will reliably be limited to a value that is not harmful to the piezoelectric material.

The distribution plate 22 is securely bonded to the top surface of the membrane 18 by means of adhesive layer 42 and defines a chamber 44 that accommodates the actuator 20 with sufficient play so as not to obstruct the piezoelectric deformation of the actuator. The actuator 20 will thus be shielded not only from the ink in the pressure chamber 16 and in the supply system but also from ambient air, so that a degradation of the actuator due to ageing of the piezoelectric material is minimized.

The chamber 44 may be filled with a gas such as nitrogen or argon that does not react with the piezoelectric material, or may be evacuated or held under a slight sub-atmospheric pressure. If, in another embodiment, the chamber 44 contains air at atmospheric pressure, it preferably communicates with the environment through a restricted vent hole, so that the pressure in the chamber may be balanced with the atmospheric pressure, but the exchange of air is restricted so as to avoid ageing of the piezo.

Above the actuator chamber 44 and separated therefrom, the distribution plate 22 defines a wide ink supply channel 46 that is connected, at at least one end thereof, to an ink reservoir (not shown). Optionally, the ink reservoir may be provided directly on top of the ink channel 46 in place of the cover plate 24.

In a position laterally offset from the actuator chamber 44, the distribution plate 22 defines a feedthrough 48 that connects the ink supply channel 46 to the pressure chamber 16 via a filter passage 50 formed by small perforations in the membrane 18. The filter passage 50 prevents impurities that may be contained in the ink from entering into the pressure chamber 16 and at the same time restricts the communication between the ink supply channel 46 and the pressure chamber 16 to such an extent that a pressure may be built up in the pressure chamber 16 by means of the actuator 20. To that end, the piezoelectric layer 36 of the actuator deforms in a flexural mode when a voltage is applied to the electrodes 32, 34.

When an ink droplet is to be expelled from the nozzle 12, the actuator is preferably energized with a first voltage having such a polarity that the piezoelectric layer 36 bulges away from the pressure chamber 16 and thus deflects the membrane 18 so as to increase the volume of the pressure chamber. As a result, ink will be sucked in through the filter passage 50. Then, the voltage is turned off, or a voltage pulse with opposite polarity is applied, so that the volume of the pressure chamber 16 is reduced again and a pressure wave is generated in the liquid ink contained in the pressure chamber. This pressure wave propagates to the nozzle 12 and causes the ejection of the ink droplet.

The above-described construction of the ink jet device, with the ink supply channel 46 being formed on top of the pressure chamber 16 (and on top of the actuator 20) has the advantage that it permits a compact configuration of a single nozzle and actuator unit and, consequently, permits a high integration density of a chip formed by a plurality of such units. As a result, a high nozzle density can be achieved for high resolution and high speed printing. Nevertheless, the device may be produced in a simple and efficient manufacturing process that is particularly suited for mass production. In particular, the electrical connections and, optionally, electrical components 52 can easily be formed at one side of the membrane 18 before the same is assembled with the distribution plate 22.

It will be understood that the metal layer forming the ground electrode 32 (or, alternatively, an electrode for energising the actuator) is led out in a position offset from the filter passage 50 in the direction normal to the plane of the drawing in FIG. 1 or is formed around that filter passage.

Figure 2:
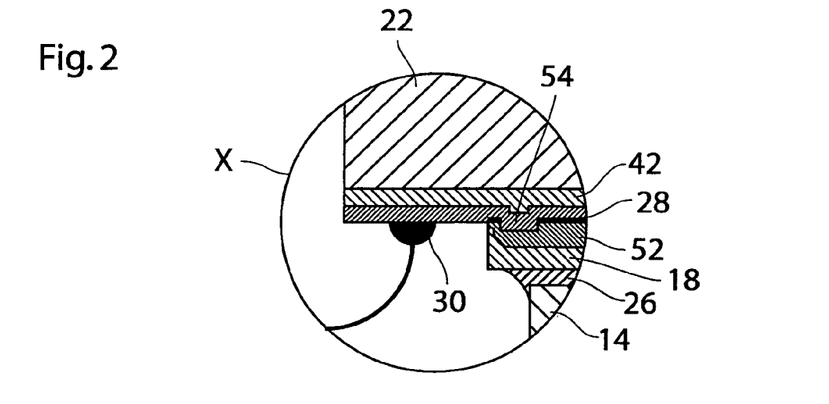
FIG. 2 is an enlarged detail of the device shown in FIG. 1.

FIG. 2 is an enlarged view of a detail that has been marked by a circle X in FIG. 1. In the example shown, part of an electronic component 52, e.g., a sensor or a switching transistor or driving circuit for controlling the actuator 20, has been embedded in the top surface of the membrane 18 by suitably doping the silicon material. Further, in that example, an extension or tab of the electrode 32 forms a reliable connection with the electronic component 52 through an opening 54 in the dielectric layer 51 on the surface of the membrane.

Figure 3:
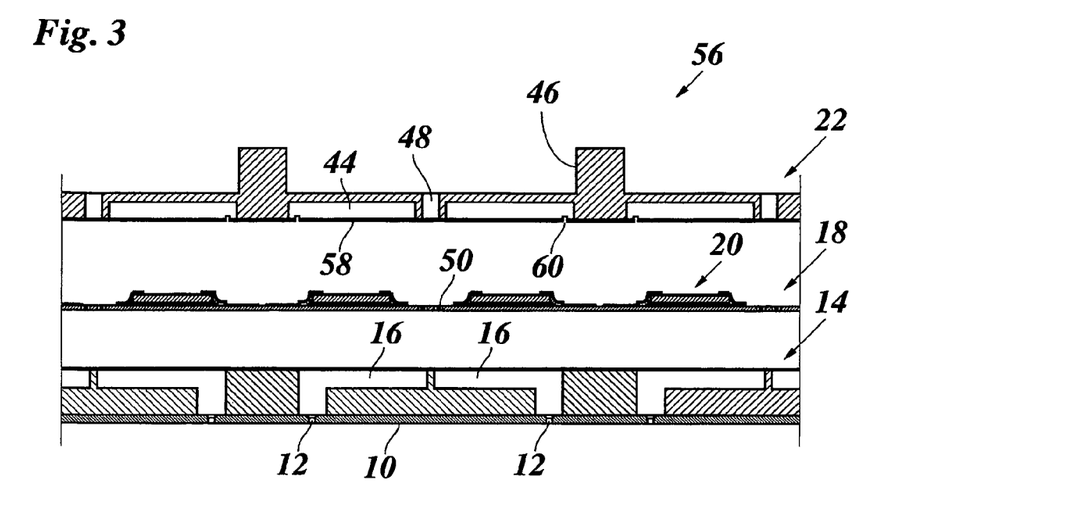
FIG. 3 is a partial sectional view of components of an ink jet device forming an array of a plurality of nozzle and actuator units.

FIG. 3 illustrates a chip 56 comprising a plurality of nozzle and actuator units that are constructed in accordance with the principles that have been described in conjunction with FIG. 1. Here, the main components of the chip, i.e., the chamber plate 14, the membrane 18 with the actuators 20, and the distribution plate 22, have been shown separated from one another for reasons of clarity.

In this example, the pressure chambers 16 are alternatingly arranged and rotation-symmetrically disposed, so that pairs of these chambers may be supplied with ink from a common channel 46 and a common feedthrough 48. The filter passages 50 for each pressure chamber 16 are arranged above an end portion of the respective pressure chamber 16 opposite to the end portion that is connected to the nozzle 12. This has the advantage that the pressure chambers may be flushed with ink so as to remove any air bubbles that might be contained therein and would be detrimental to the droplet generation process.

The chip 56 shown in FIG. 3 forms a two-dimensional array of nozzle and actuator units with a plurality of such units being aligned in the direction normal to the plane of the drawing in FIG. 3. In the example shown, each actuator 20 is accommodated in an individual chamber 44 that is separated from adjacent chambers by transverse walls 58 formed integrally with the distribution plate 22. As mentioned above, these chambers may communicate via restricted vent holes 60. As an alternative, the transverse walls 58 may be dispensed with, so that the actuators 20 aligned in a same column are accommodated in a common, continuous chamber 44.

Figure 4:
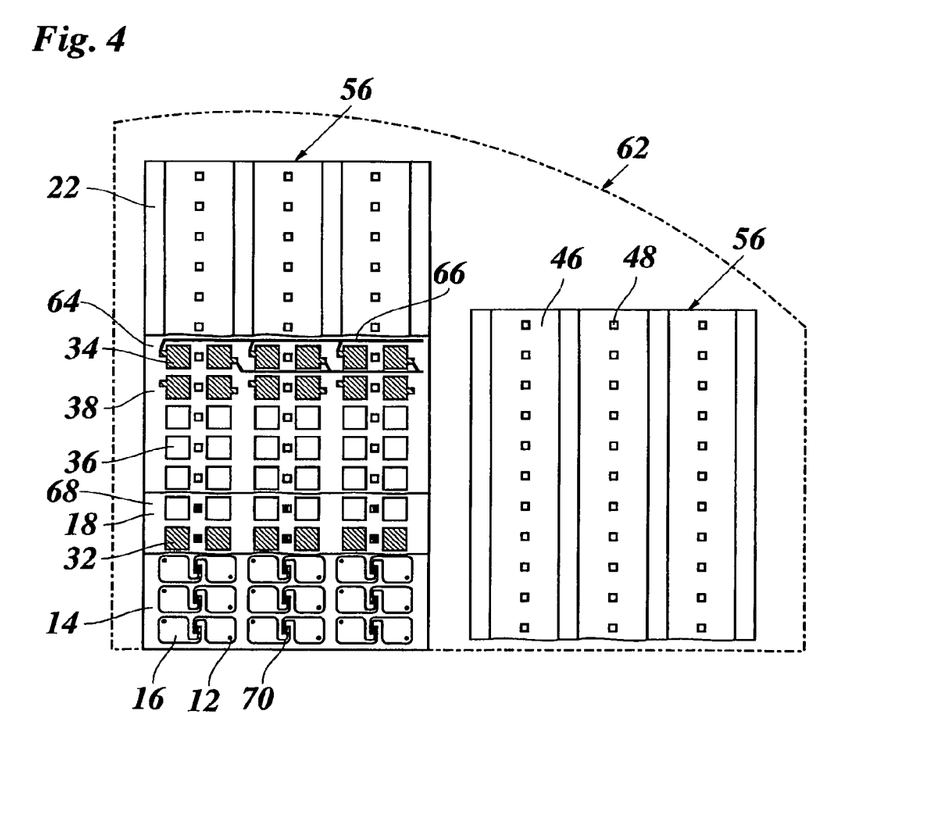
FIG. 4 is a partial plan view of arrays of the type shown in FIG. 3, as manufactured from a wafer.

Each of the membrane 18, the distribution plate 22, and, optionally, the chamber plate 14 may be formed by processing a respective wafer 62, as has been indicated in FIG. 4. The components of a plurality of chips 56 may be formed of a single wafer. What has been illustrated for the chip 56 shown on the right side in FIG. 4, is a top plan view of the distribution plate 22 with the ink supply channels 46 and feedthroughs 48. The chip on the left side in FIG. 4 has been shown partly broken away, so that the layer structure of the chip is visible.

A layer 64 directly underneath the distribution plate 22 shows five rows of actuators. The first two rows show top plan views of the top electrodes 34 with their projected leads. In this embodiment, the entire surface of the membrane 18, except the areas of the electrodes 34 and the areas coinciding with the feedthroughs 48, is covered by the insulating layer 38, as will later be explained in detail in conjunction with FIGS. 14 to 16. The first row in FIG. 4 shows also electrical tracks 66 connected to the leads and provided on the surface of the insulating layer 38. The last three rows in the layer 64 show the piezoelectric layers 36 without top electrodes.

In the next layer 68, the insulating layer 38 has been removed so that the membrane 18 with the filter passages 50 becomes visible. In the second row of this layer, the piezoelectric layers 36 have also been removed so as to illustrate the bottom electrodes 32.

The lowermost three rows of the chip show a top plan view of the chamber plate 14 with the pressure chambers 16 and the nozzles 12. In this example, the filter passages communicate with the pressure chambers 16 via labyrinths 70. These labyrinths serve to provide for a sufficient flow restriction. As shown, the pressure chambers 16 have an approximately square shape, and the labyrinth opens into the corner of the chamber that is diagonally opposite to the nozzle 12.

Preferred embodiments of the present method for producing the ink jet device and the chip 56, respectively, will now be described.

FIGS. 5 to 13 illustrate a method of forming the membrane 18 with the actuators 20.

Figure 5:
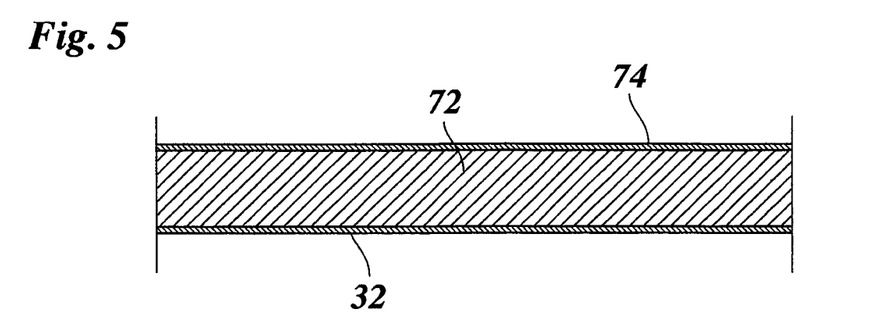
FIGS. 5-8 illustrate several steps of a method for preparing and mounting piezoelectric actuators on a membrane.

First, as is shown in FIG. 5, a slab 72 of piezoelectric material is prepared and is provided with the bottom electrode 32 and another electrode 74 on the top surface. These electrodes may be used for polarising the piezoelectric material. The slab 72 should preferably have at least the size of an entire chip 56 which. If available, a slab of wafer size could be used, or a plurality of slabs may be attached with their electrodes 74 to a wafer-size carrier plate. The thickness of the slab 72 may, for example, be in the range from 200 to 500 μm.

Figure 6:
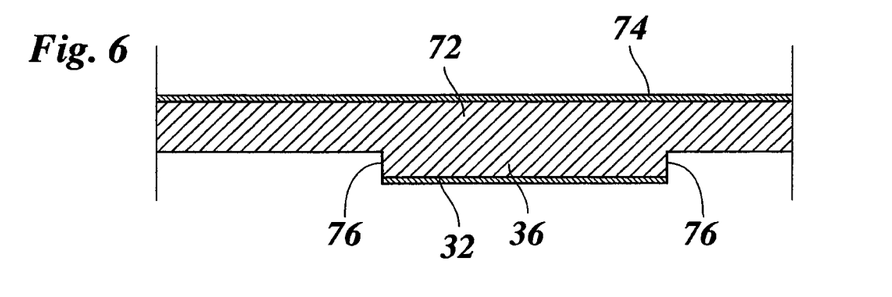

As is shown in FIG. 6, grooves 76 are cut into the bottom side of the slab 72 to a depth slightly larger than the intended thickness of the piezoelectric layer 36 of the actuator. Although not shown in the drawings, the grooves 76 extend cross-wise, thus leaving projecting platforms that will later form the piezoelectric layers 36 covered by the bottom electrodes 32. The pattern of these platforms corresponds to the intended array of actuators on the chip 56.

Figure 7:
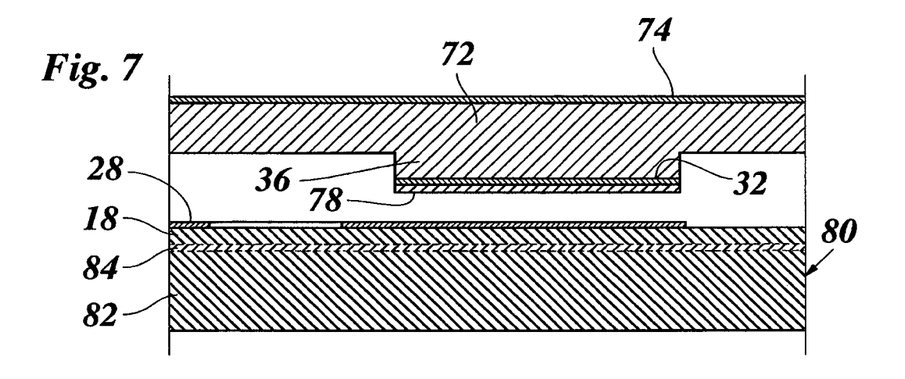

As is shown in FIG. 7, the bottom side of the bottom electrode 32 is covered with an adhesive layer 78, e.g., by tampon printing, roller coating, spray coating or the like. Further, a wafer-size carrier plate 80 is prepared, and the electrically conductive structure 28 is formed with a suitable pattern on the top surface thereof. The carrier plate 80 is preferably formed by an SOI wafer having a top silicon layer which will later form the membrane 18, a bottom silicon layer 82 that will later be etched away, and a silicon dioxide layer 84 separating the two silicon layers and serving as an etch stop.

In a practical embodiment, the top silicon layer and hence the membrane 18 may have a thickness between 1 μm and 25 μm, or about 10 μm, the etch stop has a thickness of 0.1 to 2 μm and the bottom silicon layer 82 may have a thickness between 150 and 1000 μm, so that a high mechanical stability is assured.

The slab 72 is then pressed against the top surface of the carrier plate 80, and the bottom electrodes 32 of the intended actuators are firmly bonded to the conductive structures 28 by thermocompression bonding. In this process, as has been shown in FIG. 8, the adhesive layer 78 will be squeezed out and will form a meniscus around the periphery of each piezoelectric layer 36, while the conductive structures 28 and electrodes 32 are brought into electrical contact with one another.

Figure 8:
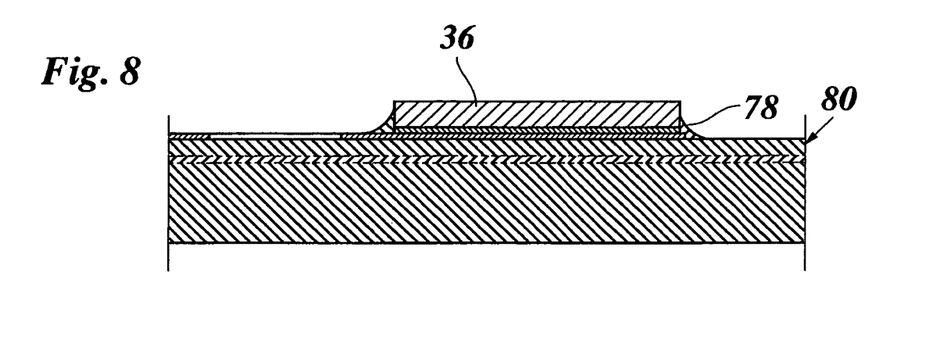

Since the piezoelectric material of the slab 72 will typically have pyroelectric properties, it is convenient to short-circuit the electrodes 32 and 74 during the thermocompression bonding process in order to avoid electrical damage. Alternatively instead of thermocompression bonding ultrasonic bonding may be used where instead of an adhesive layer a gold layer or gold bumps are provided on the bottom electrodes of the intended actuators and/or on the ground electrodes.

As is shown in FIG. 8, the electrode 74 and the continuous top portion of the slab 72 are removed, e.g., by grinding, so that only the desired array of piezoelectric layers 36 of the actuators is left on the carrier plate 80.

Figure 9:
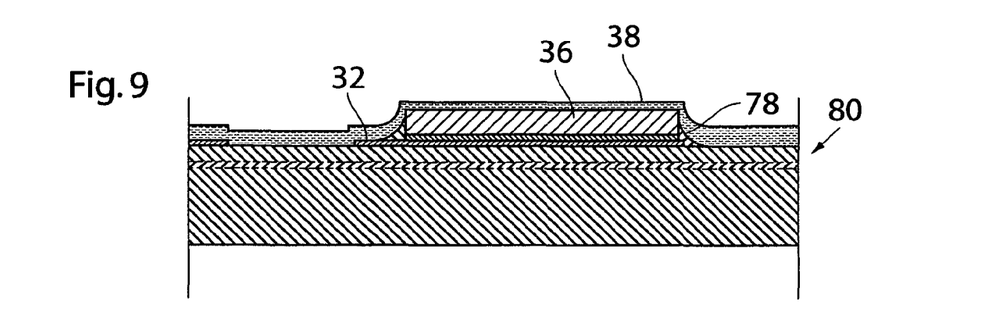
FIGS. 9-11 illustrate several steps of a method for completing the actuators on the membrane.

As is shown in FIG. 9, the next step is to form the insulating layer 38. This layer is formed, e.g., by spin coating, spray coating, sputtering PVD, CVD or the like, at least on the entire surface of the piezoelectric layer 36, on the side walls thereof and on the meniscus formed by the adhesive layer 78, respectively. The insulating layer 38 is preferably formed by a photo-curable epoxy resin such as SU8 or BCB. The portions of the layer 38 that are to be retained are exposed with light so as to cure the resin, and the non-exposed portions are removed.

Figure 10:
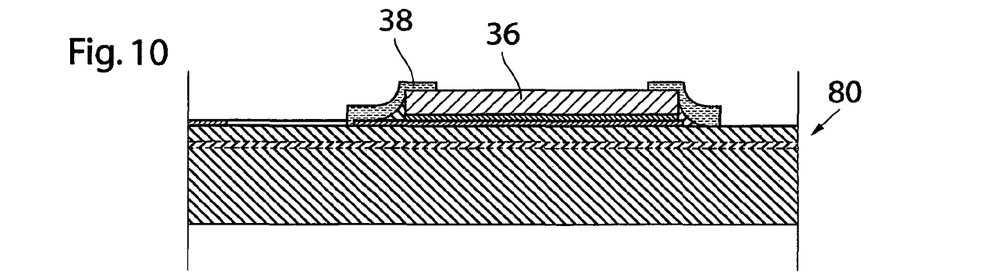

As is shown in FIG. 10, the layer 38 is removed at least from the central portion of the insulating layer 36 where the top electrode 34 is to be applied.

Figure 11:
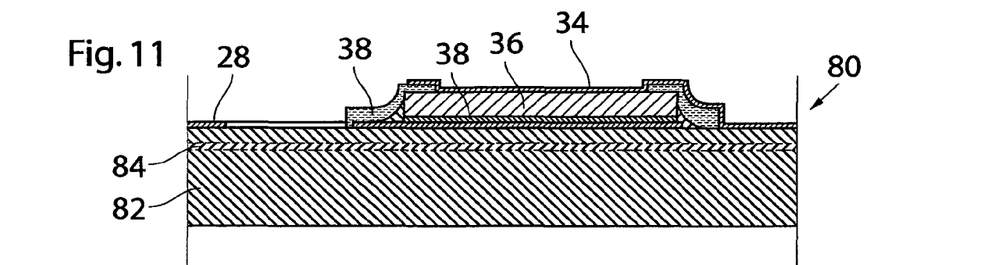

As is shown in FIG. 11, the top electrode 34 is formed on the exposed top surface of the piezoelectric layer 36, e.g., by sputtering or any other suitable process. In order to be able to electrically contact the top electrode, this electrode is extended on at least one side over the insulating layer 38 and onto the top surface of the carrier plate 80, as is shown on the right side in FIG. 11. The insulating layer 38 assures that the metal of the top electrode 34 is reliably kept away by a sufficient distance from the bottom electrode 32 and the conductive structures 28, so as to avoid short circuits and to limit the strength of the electric field developed between the electrodes.

The step shown in FIG. 11 completes the formation of the piezoelectric actuators 20.

Figure 12:
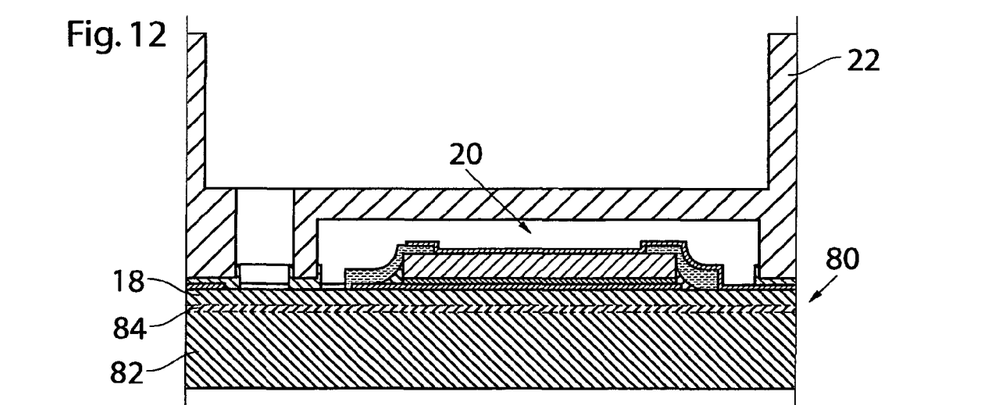
FIG. 12 illustrates a step of attaching the membrane to a rigid substrate.

In the next step, shown in FIG. 12, the distribution plate 22 is bonded to the top surface of the carrier plate 80. The distribution plate 22 will be prepared separately by etching a suitable silicon wafer. For example, the relatively coarse structures of the supply channels 46 may be formed in a cost-efficient anisotropic wet etching process, whereas the minute structures of the actuator chambers 44 and feedthroughs 48 may be formed by dry etching from below.

The distribution plate 22 then serves as a rigid substrate that can be used as a handle for manipulating the assembly. The joint wafers forming the distribution plate 22 and the carrier plate 80 are transferred to an etching stage where the lower silicon layer 82 of the carrier plate 80 is etched away up to the etch stop formed by the silicon oxide layer 84. The silicon oxide layer is subsequently removed, which leaves only the thin, flexible membrane 18 with the actuators 20 mounted thereon and firmly secured to the rigid distribution plate 22.

Figure 13:
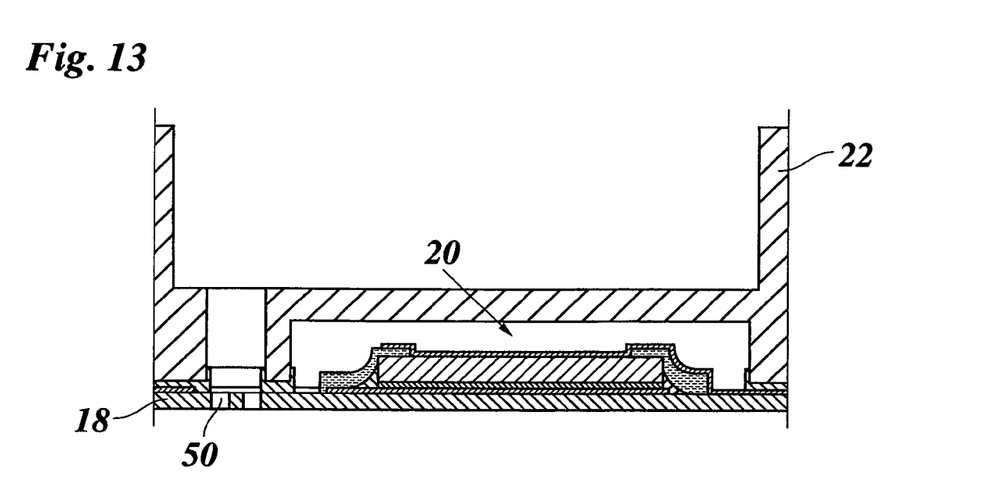
FIG. 13 illustrates a step of releasing the membrane.

The filter passages 50 may be formed in the same or in a separate etching step or by another process such as laser cutting. The result is shown in FIG. 13. Since the flexible membrane 18 is backed by the distribution plate 22, it may safely be handled in the further processing steps which include bonding the membrane 18 to the chamber plate 14. If, in this stage, the assembly of the membrane 18 and the distribution plate 22 on the one side and the chamber plate 14 on the other side have wafer size, the actuators 20 and filter passages 50 may accurately be aligned with the pressure chambers 16 for all the chips on the wafers in a single alignment step. Finally, the joint wafers will be diced to form the individual chips 56.

As an alternative, it is of course possible to dice only the joint wafers forming the membrane 18 and the distribution plate 22 and to assemble them with the separate chamber plates 14.

In the example shown in FIGS. 9-13, the insulating layer 38 has a relatively small thickness on the top side of the piezoelectric layer 36 and a larger thickness on the surface of the membrane and the electrically conductive structures 28, respectively. For comparison, FIG. 1 illustrates an embodiment where the insulating layer 38 has a uniform thickness.

Figure 14:
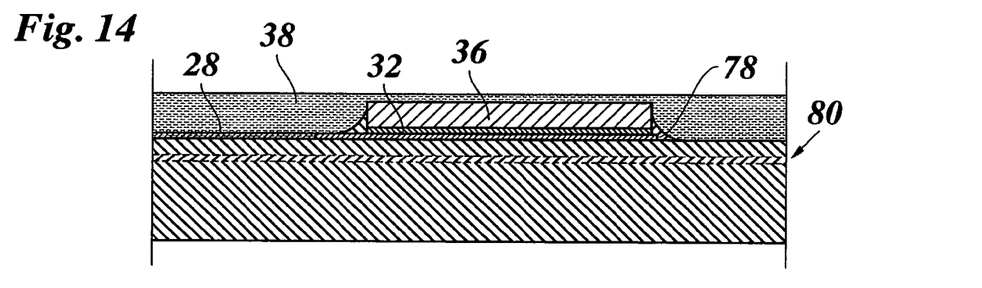
FIGS. 14-16 illustrate steps analogous to FIGS. 9-11 for a modified embodiment of the present invention.

FIG. 14 illustrates yet another embodiment, wherein the step of FIG. 9 is modified in that the insulating layer 38 is formed on the entire surface of the carrier plate 80 with a flat, continuous top surface, i.e., the piezoelectric layers 36, the bottom electrodes 32, and the electrically conductive structures 28 are entirely buried in the insulating layer 38. This embodiment corresponds to the example shown in FIG. 4.

Figure 15:
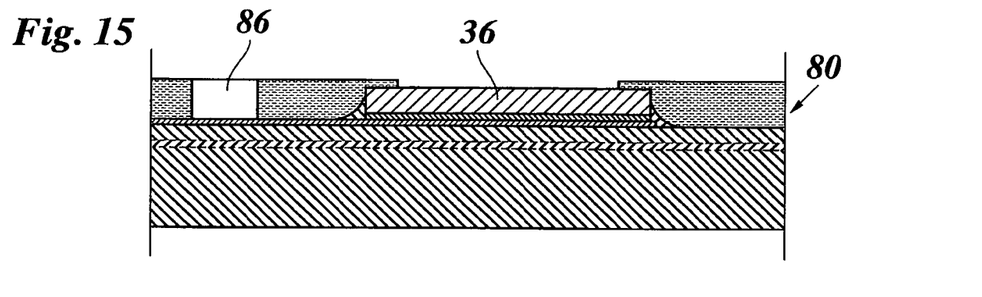

Again, as is shown in FIG. 15, the photo-curable insulating layer 38 is exposed, and the resin is removed at least in the portions covering the piezoelectric layers 36 and portions 86 coinciding with the feedthroughs 48.

Figure 16:
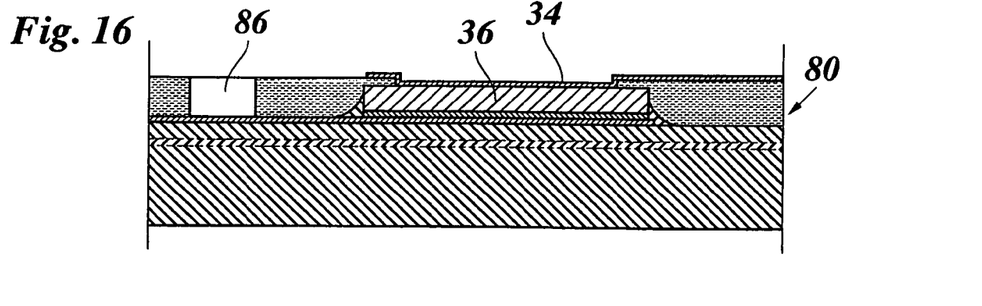

Finally, as is shown in FIG. 16, the top electrodes 34 of the actuators are applied and extended on the flat top surface of the insulating layer 38. Depending on the procedures employed for electrically contacting the actuators, this may facilitate the formation of the electrical contacts. The rest of the procedure corresponds to that explained in conjunction with FIGS. 9 to 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method of forming an array of piezoelectric actuators on a common membrane, comprising the steps of:
preparing a piezoelectric comb-shaped structure having an array of islands that are integrally connected by a continuous top portion and that are to form piezoelectric layers of the actuators, said islands having an electrode at a bottom side,
attaching the comb-shaped structure with the electrode at the bottom side, to a surface of the membrane,
removing the continuous top portion of the comb-shaped structure, thereby separating the actuators from one another, and
forming top electrodes on the top surfaces of the piezoelectric layers of the actuators,
wherein the membrane is initially configured as a thick carrier plate comprising a membrane part attached to a bulk of the carrier plate and, after the comb-shaped structure has been attached, the membrane is brought to a desired uniform thickness by removing material of the bulk of the carrier plate from the side opposite to the actuators with the membrane part remained so as to obtain a continuous flat bottom surface of the membrane part extending over a plurality of actuators.

2. The method according to claim 1, wherein the step of removing material of the bulk of the carrier plate is performed after the top electrodes have been formed.

3. The method according to claim 1, wherein the bulk of the material of the carrier plate is removed by etching, and the carrier plate is an SOI wafer having an oxide layer that is used as an etch stop.

4. The method according to claim 1, wherein a rigid distribution plate which defines an ink supply system and chambers for accommodating the actuators is attached to the carrier plate before the material of the bulk of the carrier plate is removed.

5. The method according to claim 1, wherein the step of preparing the piezoelectric comb-shaped structure further comprises the steps of:
preparing a piezoelectric slab with the electrode on the bottom side, and
cutting grooves into the bottom surface of the slab thereby forming the array of islands that are integrally connected by the continuous top portion.

6. The method according to claim 5, wherein the actuators are attached to the membrane by thermocompression bonding.

7. The method according to claim 6, wherein the the comb-shaped structure, in the state of being attached to the membrane, has electrodes on both top and bottom sides, and these electrodes on the top and the bottom sides are short-circuited during thermocompression bonding.

8. The method according to claim 1, wherein, when the actuators are attached to the membrane, a peripheral portion of a top surface of each actuator, side faces of the actuator and a surrounding portion on the membrane are covered with an insulating layer before the electrodes on the top sides are applied on the actuators.

9. The method according to claim 1, wherein, in the step of attaching the comb-shaped structure to the membrane, the electrodes of the bottom sides are contacted with an electrically conductive structure formed on the top surface of the membrane.

10. The method according to claim 1,
wherein the membrane part is attached to the bulk of the carrier plate by means of a temporary wafer bond.

11. Method according to claim 10, wherein the step of removing material from the carrier plate comprises separating the membrane part from the bulk of the carrier plate by means of thermal treatment.

* * * * *